(12) United States Patent
Yoneda et al.

(10) Patent No.: US 7,854,604 B2
(45) Date of Patent: Dec. 21, 2010

(54) SEMICONDUCTOR DEVICE FABRICATION METHOD AND PATTERN FORMATION MOLD

(75) Inventors: Ikuo Yoneda, Yokohama (JP); Shunko Magoshi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 12/018,490

(22) Filed: Jan. 23, 2008

(65) Prior Publication Data

US 2008/0214010 A1 Sep. 4, 2008

(30) Foreign Application Priority Data

Jan. 26, 2007 (JP) ............................... 2007-16816

(51) Int. Cl.
*B29C 59/00* (2006.01)

(52) U.S. Cl. ..................... 425/385; 425/174.4; 264/293

(58) Field of Classification Search ................. 438/113; 425/385, 174.4; 264/293
See application file for complete search history.

(56) References Cited

U.S. PATENT DOCUMENTS

| | | | |
|---|---|---|---|
| 5,676,983 A | * | 10/1997 | Bacher et al. ............... 425/385 |
| 5,772,905 A | | 6/1998 | Chou |
| 6,696,220 B2 | * | 2/2004 | Bailey et al. ................ 425/385 |
| 2006/0145400 A1 | * | 7/2006 | Colburn et al. .............. 264/494 |
| 2006/0266244 A1 | | 11/2006 | Kruijt-Stegeman et al. |
| 2007/0035056 A1 | | 2/2007 | Suehira et al. |
| 2007/0054097 A1 | | 3/2007 | Suchira et al. |

FOREIGN PATENT DOCUMENTS

| | | |
|---|---|---|
| JP | 2000-194142 | 7/2000 |
| JP | 2001-68411 | 3/2001 |
| JP | 2003-77807 | 3/2003 |

OTHER PUBLICATIONS

Yoneda, "Pattern forming template and pattern forming method", U.S. Appl. No. 11/866,538, filed Oct. 3, 2007.

* cited by examiner

*Primary Examiner*—Maria Veronica D Ewald
(74) *Attorney, Agent, or Firm*—Finnegan, Henderson, Farabow, Garrett & Dunner, L.L.P.

(57) ABSTRACT

According to the present invention, there is provided a semiconductor device fabrication method comprising, bringing a mold having a predetermined pattern into contact with at least a portion of an imprinting material formed on a substrate to be processed, and forming the pattern on the substrate to be processed by sequentially transferring the pattern for each shot, wherein one of a dicing region and a monitor pattern formation region of the substrate to be processed is coated with the imprinting material.

4 Claims, 9 Drawing Sheets

SEMICONDUCTOR DEVICE FABRICATION METHOD AND PATTERN FORMATION MOLD

CROSS REFERENCE TO RELATED APPLICATION

This application is based upon and claims benefit of priority under 35 USC §119 from the Japanese Patent Application No. 2007-16816, filed on Jan. 26, 2007, the entire contents of which are incorporated herein by reference.

BACKGROUND OF THE INVENTION

The present invention relates to a semiconductor device fabrication method and pattern formation mold.

To achieve the processability and mass-productivity of fine patterns of, e.g., 100 nm or less in the semiconductor device fabrication process, the nanoimprinting lithography technique that transfers a pattern by bringing a patterned mold into contact with a substrate to be processed such as a wafer is attracting attention.

The nanoimprinting method is a technique by which a master on one surface of which a predetermined pattern to be transferred is formed, i.e., a mold is brought into contact with an imprinting material such as a resist layer formed on a substrate by coating, and the pattern is transferred by setting the imprinting material.

Known examples of the nanoimprinting method are thermal imprinting methods mainly using a thermoplastic resin disclosed in patent references 2 and 3 (to be described later), and optical imprinting methods using a photosetting resist disclosed in patent references 4 and 5 (to be described later).

As an example of the nanoimprinting methods, an outline of the sequence of pattern transfer performed by the optical nanoimprinting method will be described below.

The optical imprinting method comprises steps of (1) coating a substrate to be processed with a photosetting resin, (2) aligning the substrate and a mold and bringing them into contact with each other, (3) setting the resin by irradiation with light, (4) releasing the material from the mold, and (5) removing the residual film. In the residual film removing step, anisotropic etching using an oxygen plasma is mainly used.

In semiconductor lithography, the process advances to a step of etching an undercoat after pattern transfer is performed by the nanoimprinting method.

The optical nanoimprinting method SFIL developed by Molecular Imprints Inc., U.S.A. is a method expected to be applied to semiconductor lithography.

In this SFIL, however, a wafer is coated with an imprinting material serving as a resist for each shot, and control is performed such that the imprinting material spreads inside the shot. Therefore, almost no imprinting material exists in a region connecting the shots.

In this region, no element pattern is formed. Generally, this region is a dicing region, and an aligning mark or an underlying pattern such as a monitor pattern of some kind is formed in the region.

In the conventional imprinting method, however, the region connecting shots is not covered with the imprinting material.

Accordingly, a plasma or the like damages the underlying pattern in the etching step after imprinting. This interferes with operations such as alignment after that, and decreases the yield.

References disclosing the conventional nanoimprinting methods are as follows.
Japanese Patent Laid-Open No. 2000-194142
U.S. Pat. No. 5,772,905
Japanese Patent Laid-Open No. 2003-77807
Japanese Patent Laid-Open No. 2001-68411

SUMMARY OF THE INVENTION

According to one of the present invention, there is provided a semiconductor device fabrication method comprising, bringing a mold having a predetermined pattern into contact with at least a portion of an imprinting material formed on a substrate to be processed, and forming the pattern on the substrate to be processed by sequentially transferring the pattern for each shot,
wherein one of a dicing region and a monitor pattern formation region of the substrate to be processed is coated with the imprinting material.

According to one of the present invention, there is provided a semiconductor device fabrication method comprising, bringing a mold having a predetermined pattern into contact with an imprinting material on a substrate to be processed for each shot, and forming the pattern on the substrate to be processed by sequentially transferring the pattern, wherein the mold is placed such that at least portions of two adjacent shot regions of the shots overlap each other when forming the pattern.

According to one of the present invention, there is provided a pattern formation mold to be brought into contact with an imprinting material on a substrate to be processed for each shot, thereby sequentially transferring a predetermined pattern, wherein one surface has a square shape, and has a pattern region in which the pattern is formed, and a peripheral region surrounding the pattern region, the peripheral region has a first region having a height equal to a maximum height of the pattern region, and a second region lower than the first region, and the second region has an L-shaped region formed into an L-shape in one corner of the square.

DETAILED DESCRIPTION OF THE INVENTION

Embodiments of the present invention will be explained below with reference to the accompanying drawings.

(1) Embodiment

Figure 1:
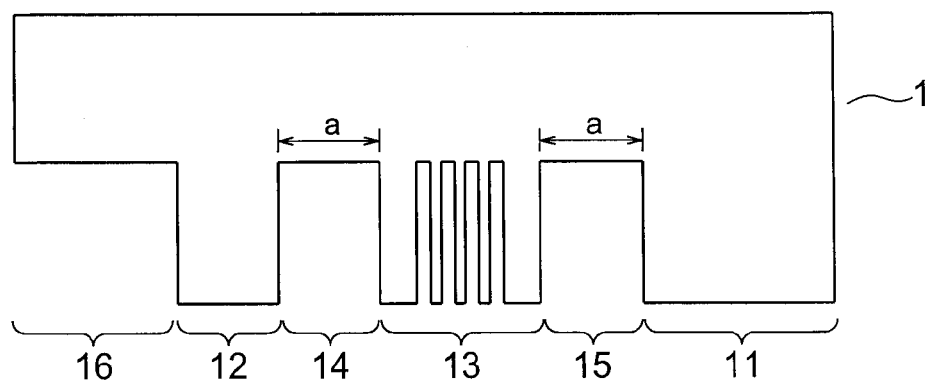
FIG. 1 is a longitudinal sectional view showing the sectional structure of a pattern formation mold according to an embodiment of the present invention.
Figure 2:
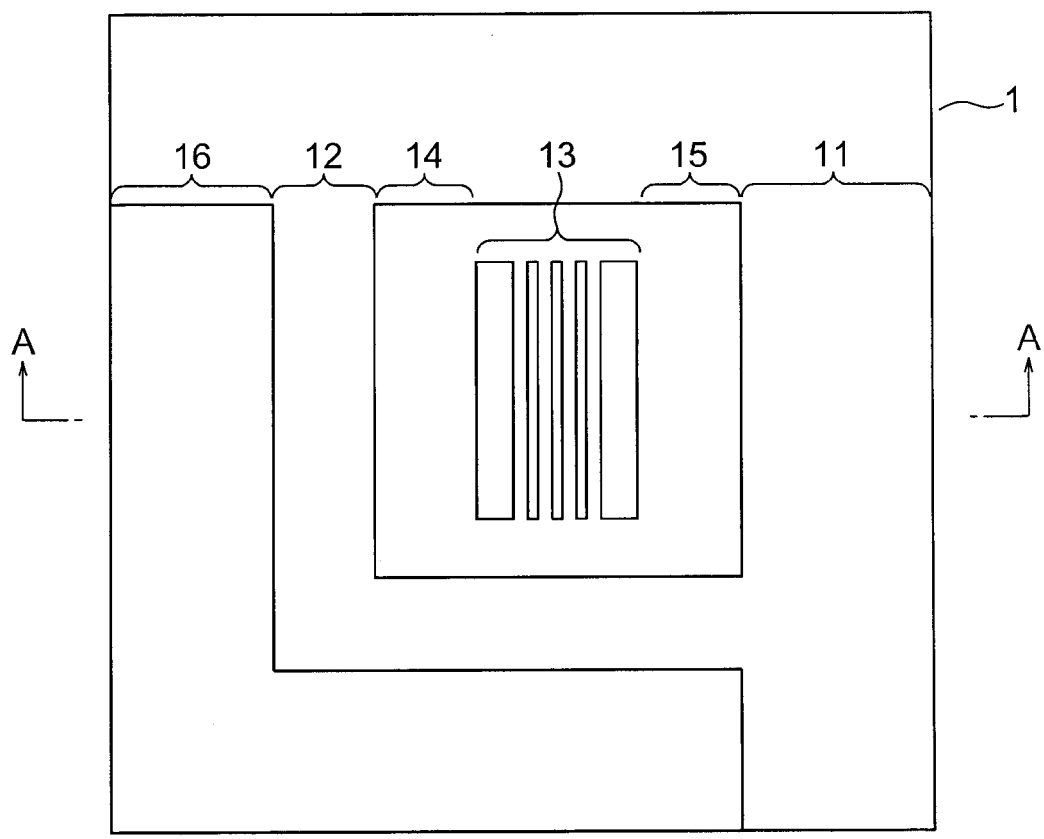
FIG. 2 is a lower surface view of FIG. 1, which shows the planar structure of the pattern formation mold.

FIG. 1 shows the longitudinal sectional structure of a mold 1 to be used in a semiconductor device fabrication method using a nanoimprinting method according to an embodiment of the present invention. FIG. 2 is a lower surface view of FIG. 1. Note that FIG. 1 is a longitudinal sectional view taken along a line A-A in FIG. 2.

The mold 1 has a projecting region 11 in the right end portion and a projecting region 12 on the left side in the longitudinal sectional view of FIG. 1. Between the projecting regions 11 and 12, low recessed regions 14 and 15 having a predetermined width a are formed, and a pattern region 13 having a pattern are formed between the regions 14 and 15. In addition, a low recessed region 16 similar to the regions 14 and 15 is formed in the left end portion.

The regions 11 to 16 are arranged with a positional relationship as shown in FIG. 2. That is, the pattern region 13 is positioned in an almost central portion of the mold 1, and the low regions 14 and 15 are formed around the pattern region 13. The projecting regions 11 and 12 are formed to surround the regions 14 and 15, and the region 16 is formed into an L-shape in one of the four corners. The region 11 is also formed into an L-shape in another corner diametrically opposite to the corner where the region 16 is formed.

As will be described later, a thick imprinting material remains in the low recessed regions 14, 15, and 16 after imprinting. This embodiment is characterized by performing imprinting such that the end portions of adjacent shots overlap each other, and the imprinting material remains in these overlapping regions. The region 16 is given the recessed shape by taking account of this point.

A procedure of forming a desired pattern by the imprinting method by using the mold as described above will be explained below.

Figure 3:
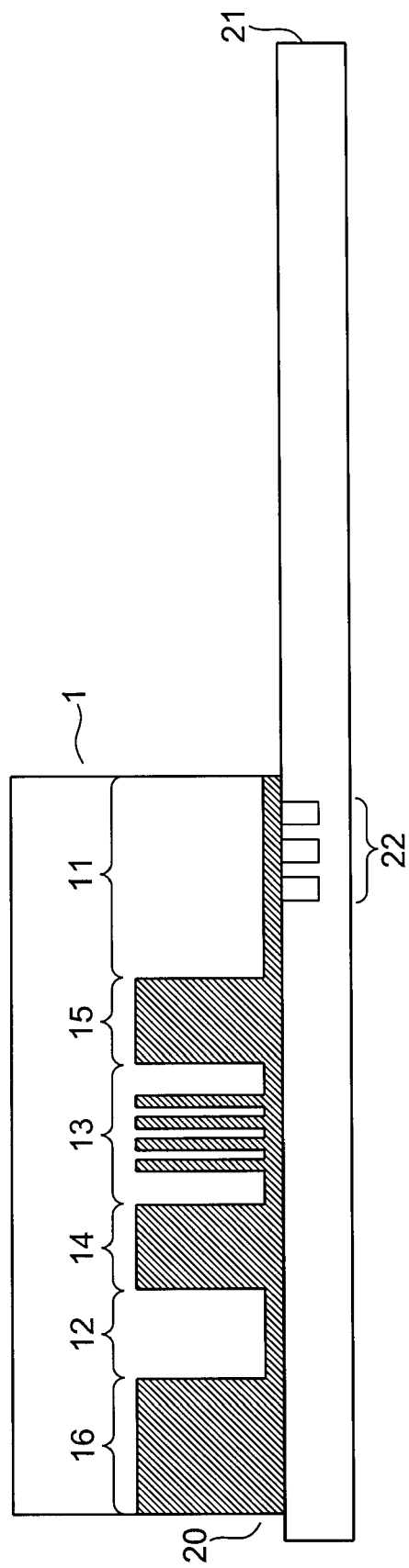
FIG. 3 is a longitudinal sectional view showing a predetermined step of a semiconductor device fabrication method according to the embodiment.

As shown in FIG. 3, the mold is used to form an etching mask on a semiconductor substrate 21 as a substrate to be processed. In this state, a plurality of semiconductor chips are formed on the semiconductor substrate 21 by a plurality of shots. Boundary regions between the shots are dicing regions where an alignment mark or an underlying pattern 22 such as a monitor pattern of some kind is formed.

First, as the first shot as shown in FIG. 3, an imprinting material 20 equivalent to a pattern transfer layer is supplied onto a region corresponding to the shot on the semiconductor substrate 21, and the mold 1 is placed on the imprinting material 20.

When supplying the imprinting material, control is performed such that the supply amount in a region where a thin imprinting material remains, e.g., in the vicinity of the projecting region 11 on the right side of the mold shown in FIG. 3 is smaller than that in the left region 16 where a thick imprinting material remains. Since this prevents the imprinting material supply amount from becoming excessive near the projecting region 11, it is possible to avoid an event in which the imprinting material overflows from the end face of the projecting region 11.

Figure 4:
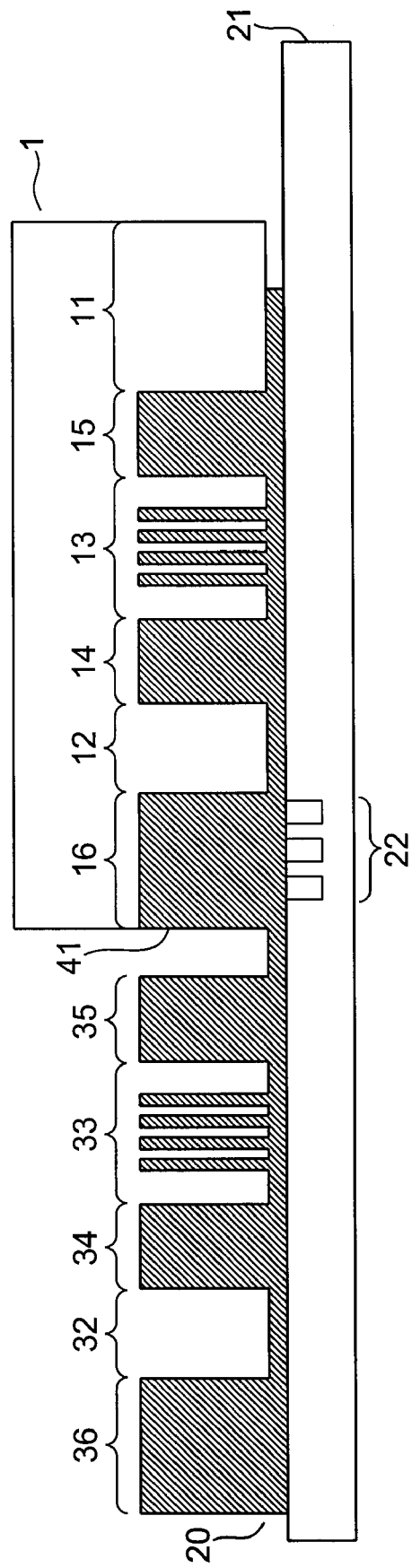
FIG. 4 is a longitudinal sectional view showing the sectional structure of a pattern formation mold according to the embodiment.

After the mold 1 is removed, the process advances to an adjacent region on the right side as shown in FIG. 4. As the second shot, the imprinting material is supplied, and the mold 1 is placed on the imprinting material. When placing the mold 1, as shown in FIG. 4, the second shot is set such that the left region 16 overlaps the region 11 formed by the first shot. After that, the mold 1 is removed.

Figure 5:
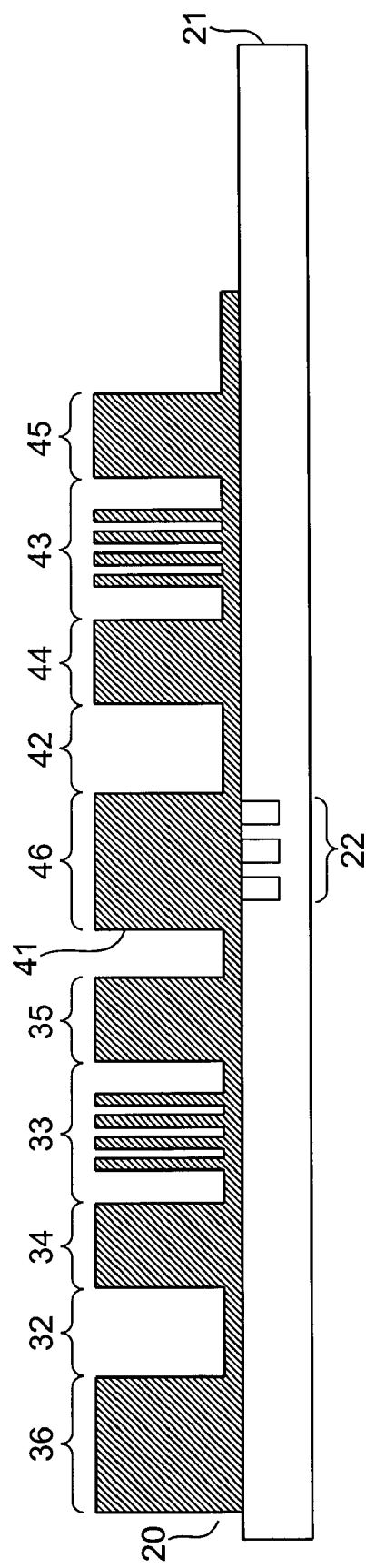
FIG. 5 is a longitudinal sectional view showing the sectional structure of a pattern formation mold according to the embodiment.

As shown in FIG. 5, a region 46 in which both the first and second shots are imprinted is covered with a thick imprinting material 20 by the region 16 recessed by the second shot.

When a plurality of shots are performed in the same region as described above, the height of the mold portion changes from one shot to another.

More specifically, the mold portion when the second shot is performed is lower than that when the first shot is performed.

Figure 6:
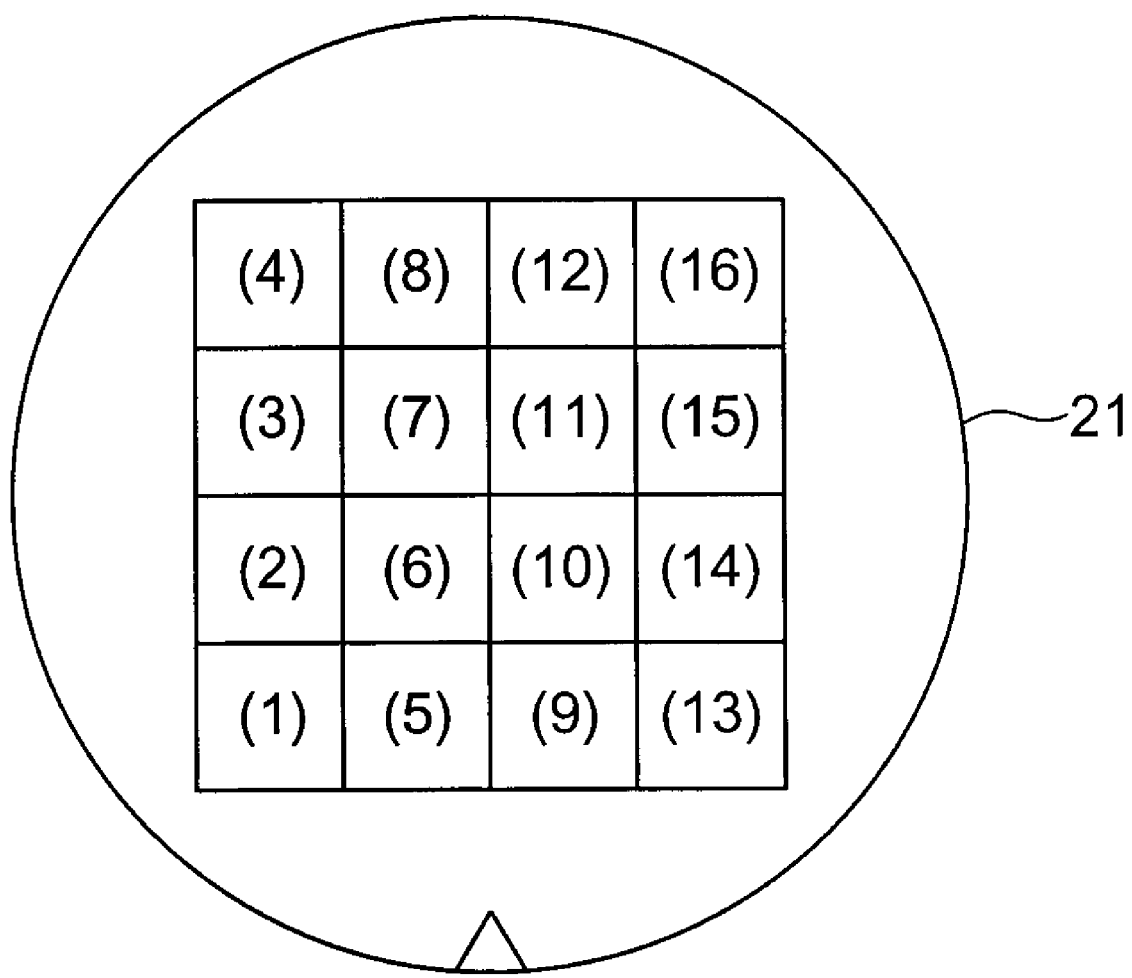
FIG. 6 is a view for explaining the arrangement of shots sequentially performed on a semiconductor substrate in the semiconductor device fabrication method according to the embodiment.
Figure 7:
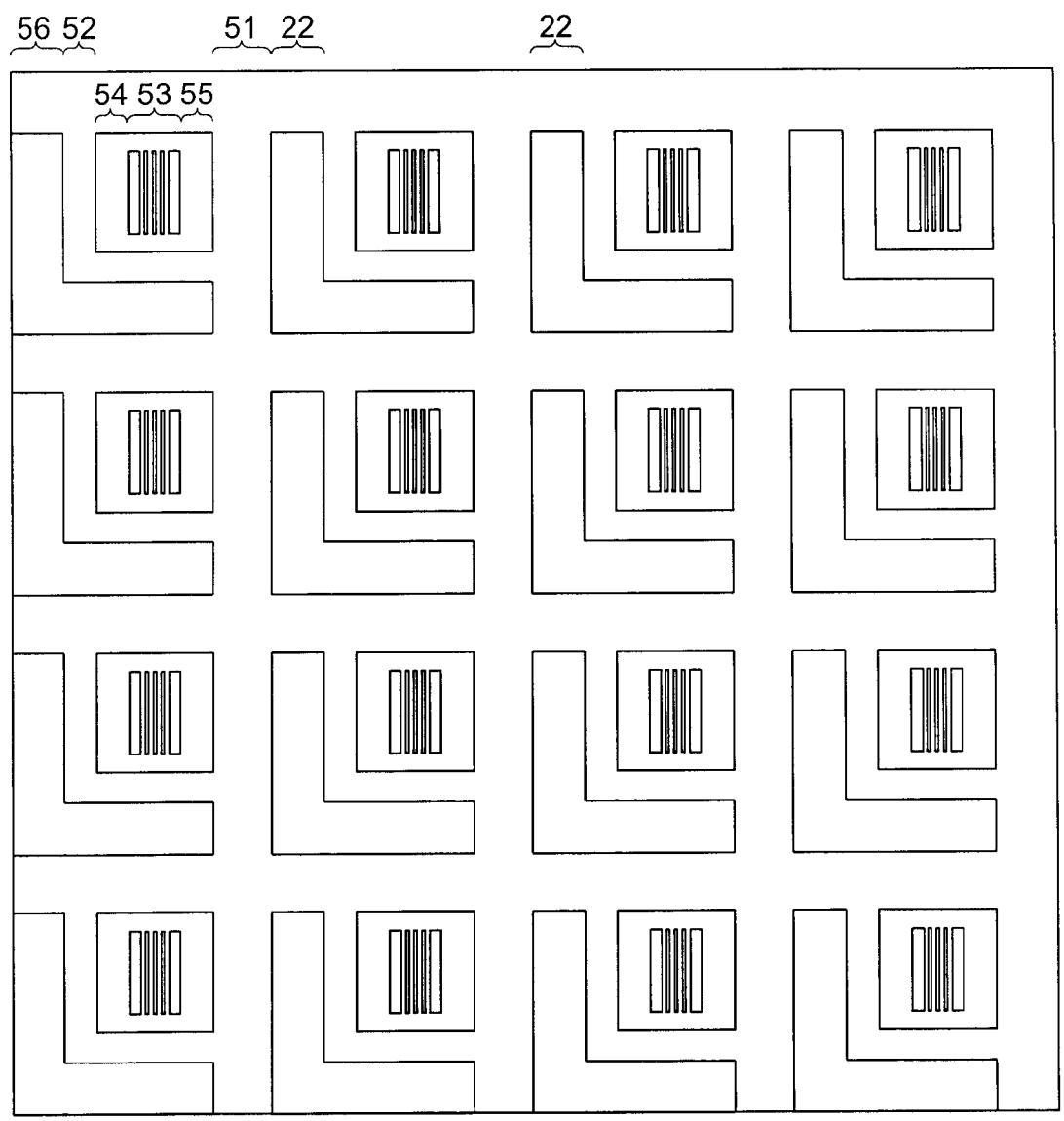
FIG. 7 is a plan view showing the state in which imprinting is performed on the semiconductor substrate by the semiconductor device fabrication method according to the embodiment.

FIG. 6 shows the order of shots (1) to (16) by which imprinting is performed on the semiconductor substrate 21, and an example of the arrangement. FIG. 7 shows patterns on the semiconductor substrate 21 obtained by performing imprinting following the above procedure. A region 51 exists between the individual shots. The underlying pattern 22 in this region is covered with the imprinting material 20 since the adjacent shots partially overlap each other as described above.

In this embodiment as described above, the surface of the underlying pattern 22 such as an alignment mark on the semiconductor substrate 21 is protected by the imprinting material.

This makes it possible to avoid an event in which the underlying pattern 22 formed in the region connecting the shots is damaged in the etching step or the like and interferes with the subsequent steps. This helps increase the yield.

Note that the region where the shots overlap each other is not limited to the underlying pattern of the substrate to be processed, but may also be a dicing region, monitor pattern formation region, or the like.

(2) Comparative Example

Figure 8:
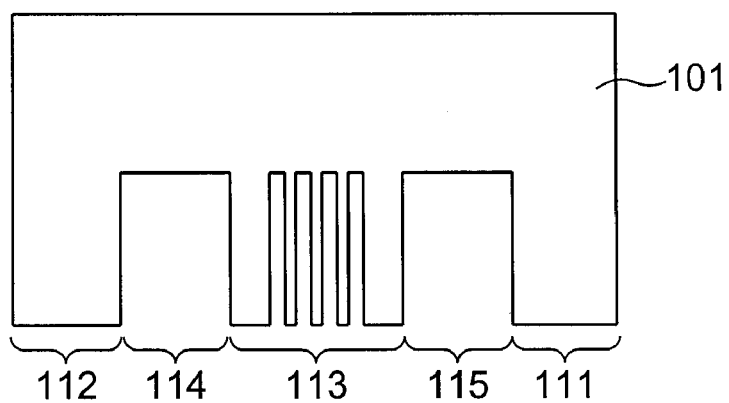
FIG. 8 is a longitudinal sectional view showing the sectional structure of a pattern formation mold according to a comparative example.
Figure 9:
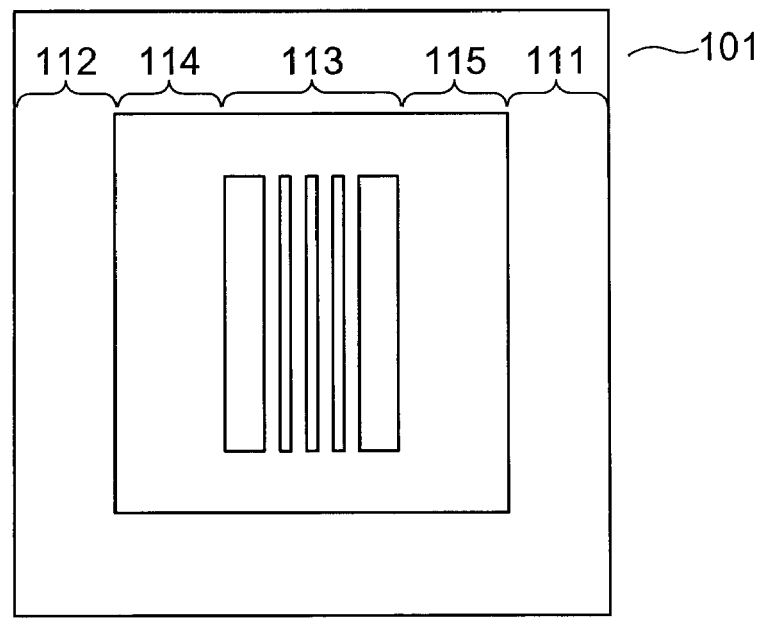
FIG. 9 is a lower surface view of FIG. 8, which shows the planar structure of the pattern formation mold.

FIG. 8 is a longitudinal sectional view of a pattern formation mold 101 according to a comparative example. FIG. 9 is a lower surface view of FIG. 8. A pattern region 113 is formed in an almost central portion of the mold 101. Low recessed regions 114 and 115 are formed to surround the pattern region 113. Projecting regions 111 and 112 are formed to surround the low recessed regions 114 and 115.

The mold 101 according to the comparative example differs from the mold 1 according to the embodiment shown in FIGS. 1 and 2 in that there is no low recessed L-shaped region 16 exists in any corner.

Figure 10:
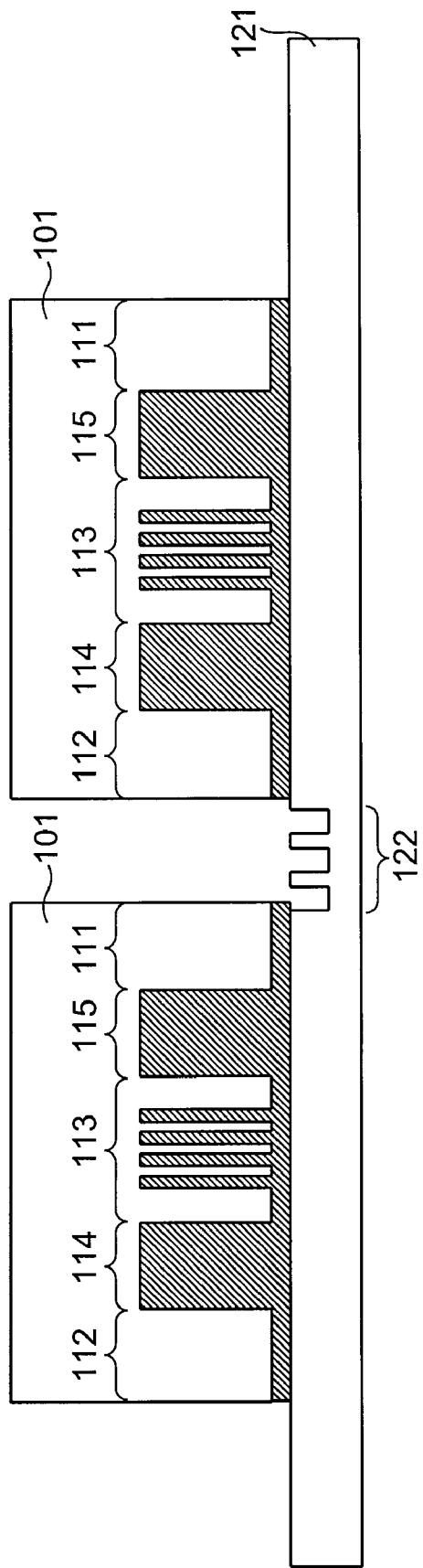
FIG. 10 is a longitudinal sectional view showing a predetermined step of a semiconductor device fabrication method according to the comparative example.

In this comparative example, unlike in the above embodiment, the end portions of adjacent shots do not overlap each other during imprinting as shown in FIG. 10. Accordingly, no imprinting material exists in regions connecting the shots.

Figure 11:
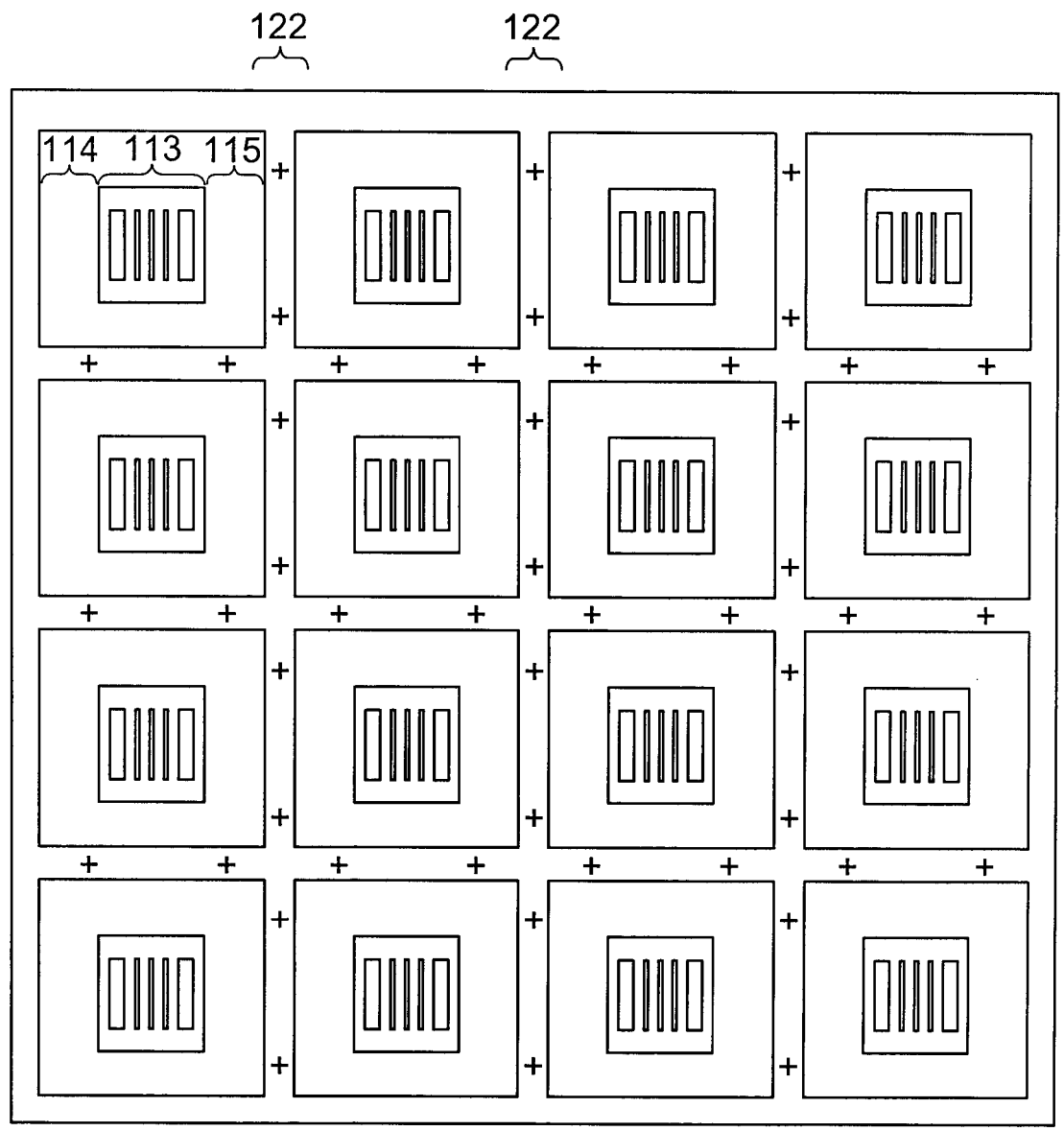
FIG. 11 is a plan view showing the state in which imprinting is performed on a semiconductor substrate by the semiconductor device fabrication method according to the comparative example.

FIG. 11 shows patterns obtained by sequentially performing imprinting by a semiconductor device fabrication method according to the comparative example by using the same order and arrangement of shots as explained with reference to FIG. 6 in the above embodiment. Underlying patterns 122 between the shots are not covered with the imprinting material but exposed.

Consequently, the underlying patterns 122 are damaged in the subsequent step, e.g., damaged by irradiation with a plasma during etching, and interferes with operations such as alignment, thereby decreasing the yield.

By contrast, the above embodiment makes it possible to avoid an event in which the underlying patterns formed in the regions connecting the shots are damaged. More specifically, it is possible to protect the underlying patterns 122 positioned between the shots from being damaged by performing imprinting such that the end portions of adjacent shots overlap each other. This ensures the operability of, e.g., alignment, and helps increase the yield.

The above embodiment is merely an example and does not limit the present invention. Accordingly, the present invention can be variously modified within the technical scope of the invention.

What is claimed is:

1. A pattern formation mold to be brought into contact with an imprinting material on a substrate to be processed for each shot, thereby sequentially transferring a predetermined pattern, wherein one surface has a square shape, and has a pattern region in which the pattern is formed, and a peripheral region surrounding the pattern region, the peripheral region has a first region having a height equal to a maximum height of the pattern region, and a second region lower than the first region, and the second region has an L-shaped region in one corner of the one surface having the square shape, the one surface being a lower surface of the mold, and the L-shaped region having an L-shape in a plan view of the pattern formation mold.

2. A mold according to claim 1, wherein the pattern region has a three-dimensional shape corresponding to the pattern, and the second region of the peripheral region has a third region surrounding the pattern region.

3. A mold according to claim 2, wherein the first region of the peripheral region has a fourth region surrounding the third region.

4. A mold according to claim 1, wherein the first region has a second L-shaped region formed on said one surface to oppose the L-shaped region with the pattern region sandwiched therebetween.

* * * * *